(12) United States Patent
Nakashiba (10) Patent No.: US 6,760,073 B1
(45) Date of Patent: Jul. 6, 2004

(54) SOLID-STATE IMAGE SENSOR

(75) Inventor: Yasutaka Nakashiba, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/396,735

(22) Filed: Sep. 15, 1999

(30) Foreign Application Priority Data

Sep. 18, 1998 (JP) ............................................ 10-264591

(51) Int. Cl.$^7$ ............................ H04N 3/14; H04N 5/335
(52) U.S. Cl. ........................ 348/314; 348/299; 257/223; 257/230; 257/445
(58) Field of Search ................................ 348/299, 314, 348/322; 257/223, 229, 230, 445, 500, 509

(56) References Cited

U.S. PATENT DOCUMENTS

| | | | | |
|---|---|---|---|---|
| 5,902,995 A | * | 5/1999 | Morimoto ................... | 348/314 |
| 6,215,521 B1 | * | 4/2001 | Surisawa et al. ........... | 348/314 |
| 6,278,487 B1 | * | 8/2001 | Nakashiba .................. | 348/314 |

FOREIGN PATENT DOCUMENTS

| | | |
|---|---|---|
| JP | 58-137249 | 8/1983 |
| JP | 59-19480 | 1/1984 |
| JP | 62-154881 | 7/1987 |
| JP | 62-156859 | 7/1987 |
| JP | 62-157479 | 7/1987 |
| JP | 63-228747 | 9/1988 |
| JP | 8-256429 | 10/1996 |
| JP | 9-223788 | 8/1997 |
| JP | 9-307094 | 11/1997 |
| JP | 10-107250 | 4/1998 |
| JP | 10-107354 | 4/1998 |
| JP | 10-173162 | 6/1998 |
| JP | 10-326887 | 12/1998 |

OTHER PUBLICATIONS

Ishihara, et al., "Interline CCD Image Sensor with Vertical Overflow Drain", Television Institute Brochure, vol. 37, No. 10, Oct. 1983, pp. 782(16)–787(21).

Japanese Office Action dated Jan. 26, 2001, with partial English translation.

* cited by examiner

*Primary Examiner*—Wendy R. Garber
*Assistant Examiner*—Matthew L Rosendale
(74) *Attorney, Agent, or Firm*—McGinn & Gibb, PLLC (57) ABSTRACT

There is provided a solid-state image sensor including (a) a plurality of first charge transfer sections each for vertically transferring electric charges, formed on a surface of a semiconductor layer, (b) a second charge transfer section for horizontally transferring electric charges, formed adjacent to one ends of the first charge transfer sections, the second charge transfer section including a charge barrier region and a charge accumulating region, (c) a first potential barrier section located adjacent to the second charge transfer section, (d) an excessive charge exhausting section located adjacent to the first potential barrier section, and (e) a plurality of second potential barrier sections located in the first potential barrier section, the second potential barrier section being spaced away from adjacent ones. The solid-state image sensor makes it possible to prevent signal charges from leaking into the excessive charge exhausting section, which ensures enhancement in a charge transfer efficiency.

27 Claims, 11 Drawing Sheets

SOLID-STATE IMAGE SENSOR

BACKGROUND OF THE INVENTION

1. Field of the Invention

The invention relates to a solid-state image sensor, and more particularly to a solid-state image sensor including an excessive charge exhausting section located adjacent to a charge transfer section for horizontally transferring electric charges therethrough.

2. Description of the Related Art

A solid-state image sensor has been conventionally used as an input device of a video-tape recorder (VTR) equipped with a camera. However, with recent need of the greater number of pixels, a solid-state image sensor has begun to be used as an input device for an electronic still camera in which optical data is converted into electric signals in place of development of a film, and the electric signals are stored in a memory to thereby make a hard copy, or the electric signals are displayed as images on a monitor screen.

Since such a solid-state image sensor as mentioned above includes a light-electricity transfer section, and charge transfer sections for vertically and horizontally transferring signal charges accumulated in the light-electricity transfer section, there might be accumulated electric charges produced by light-electricity conversion having been carried out in an unnecessary period of time, and unnecessary signal charges such as electric charges caused by a current produced at an interface between silicon and an oxide film, as well as signal charges constituting necessary image signals.

When a solid-state image sensor is used as an input device of a video-tape recorder equipped with a camera, such unnecessary signal charges are settled down to a stable level after signal charges corresponding to a couple of screens have been displayed. Hence, there is caused no serious problem.

On the other hand, when a solid-state image sensor is used as an input device of an electronic still camera, such unnecessary signal charges as mentioned above are combined with signal charges constituting image signals, causing a problem of degradation in quality of images.

In addition, if there is applied a trigger by means of a shutter button when it took much time to remove such unnecessary signal charges, there would be caused time delay until a shutter is actually open or closed from the time of application of a trigger, which might lose shutter chance.

Hence, when a solid-state image sensor is to be used as an input device of an electronic still camera, it is necessary to instantaneously remove unnecessary signal charges existing in both light-electricity transfer sections and charge transfer sections at the same time when a trigger is applied by means of a shutter, unlike when a solid-state image sensor is used as an input device of a video-tape recorder equipped with a camera.

There has been suggested many attempts for removing such unnecessary signal charges.

For instance, one of such attempts is suggested in the article "CCD Image Sensor having Vertical Overflow Structure" by Ishihara et al. in Television Institute Brochure, Vol. 37, No. 10, October 1983, pp. 782(16)–787(21). According to the article, unnecessary charges existing in light-electricity transfer sections are removed by carrying out blooming control and formation of a vertical overflow drain structure. In the blooming control, there is formed a p– semiconductor region just below an n-type semiconductor region constituting a light-electricity transfer region, and a reverse-bias voltage is applied to an $n^{3-}$ semiconductor substrate to thereby transfer excessive charges to the $n^{3-}$ semiconductor substrate. By forming the vertical overflow drain structure, it is possible to make the n-type semiconductor region depleted, and drive all signal charges into the $n^{3-}$ semiconductor substrate.

Since the charge transfer section for horizontally transferring electric charges can operate at a high rate, unnecessary charges existing in the charge transfer section are removed into a reset drain located adjacent to the horizontal charge transfer section, in an ordinary operation.

On the other hand, it is necessary to transfer unnecessary charges by a distance corresponding to at least a couple of screens in order to remove the unnecessary charges existing in charge transfer sections for vertically transferring electric charges.

Japanese Unexamined Patent Publication No. 8-256429 has suggested a method of removing such unnecessary charges existing in charge transfer sections for vertically transferring electric charges. In the suggested method, an excessive charge exhausting section is formed adjacent to the charge transfer sections. Unnecessary charges existing in the charge transfer sections are forwardly transferred, and removed into the excessive charge exhausting section.

Figure 1:
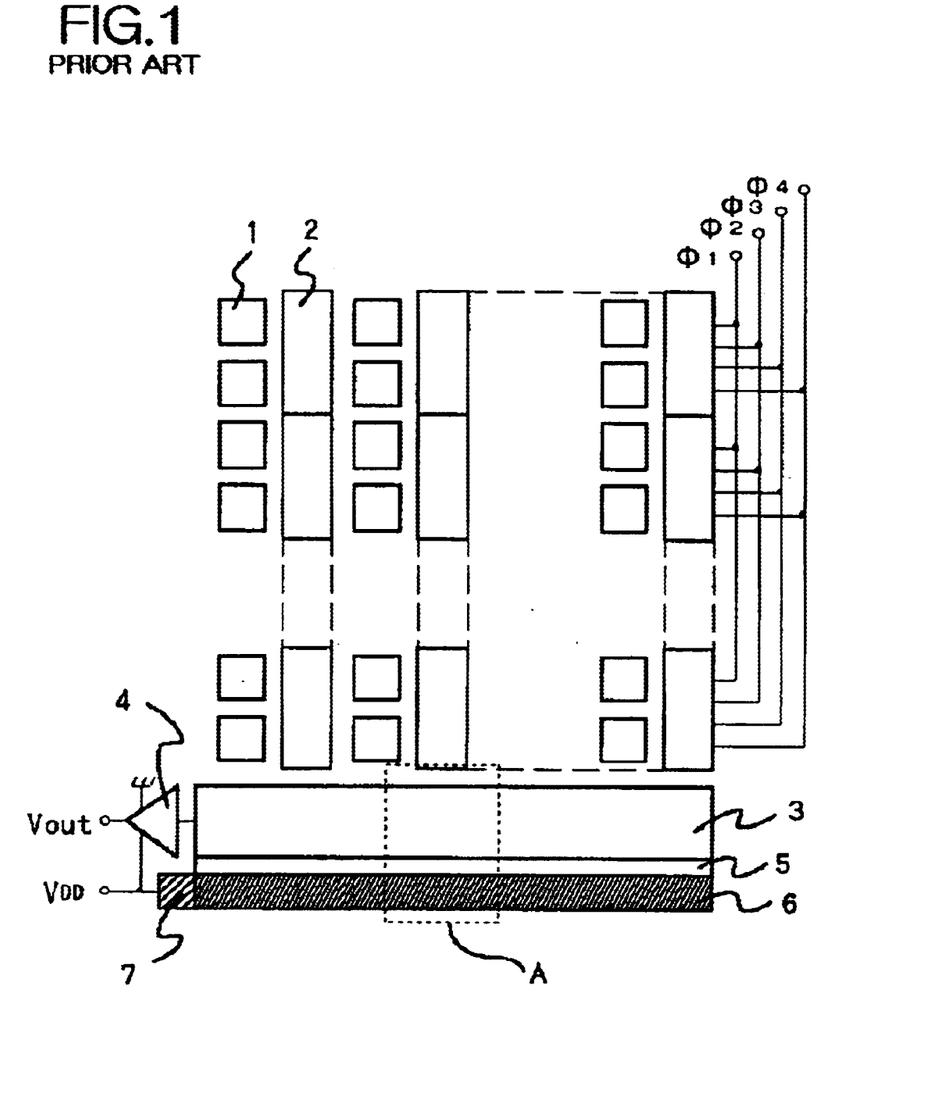
FIG. 1 is a block diagram of a conventional solid-state image sensor including a charge exhausting section adjacent to a charge transfer section which horizontally transfers electric charges therethrough.

FIG. 1 is a block diagram of a solid-state image sensor suggested in Japanese Unexamined Patent Publication No. 8-256429. The illustrated solid-state image sensor is comprised of light-electricity transfer sections 1 arranged in a plurality of lines, a plurality of first charge transfer sections 2 for vertically transferring electric charges, located adjacent to each of the light-electricity transfer sections 1, a second charge transfer section 3 for horizontally transferring electric charges, extending at one ends of both the light-electricity transfer sections 1 and the first charge transfer sections 2, an output circuit 4 electrically connected to the second charge transfer section 3, a potential barrier section 5 located adjacent to the second charge transfer section 3, an excessive charge exhausting section 6 located adjacent to the potential barrier section 5, and an $n^{++}$ semiconductor region 7 located at one end of the excessive charge exhausting section 6 and electrically connected to a power source voltage VDD.

Figure 2:
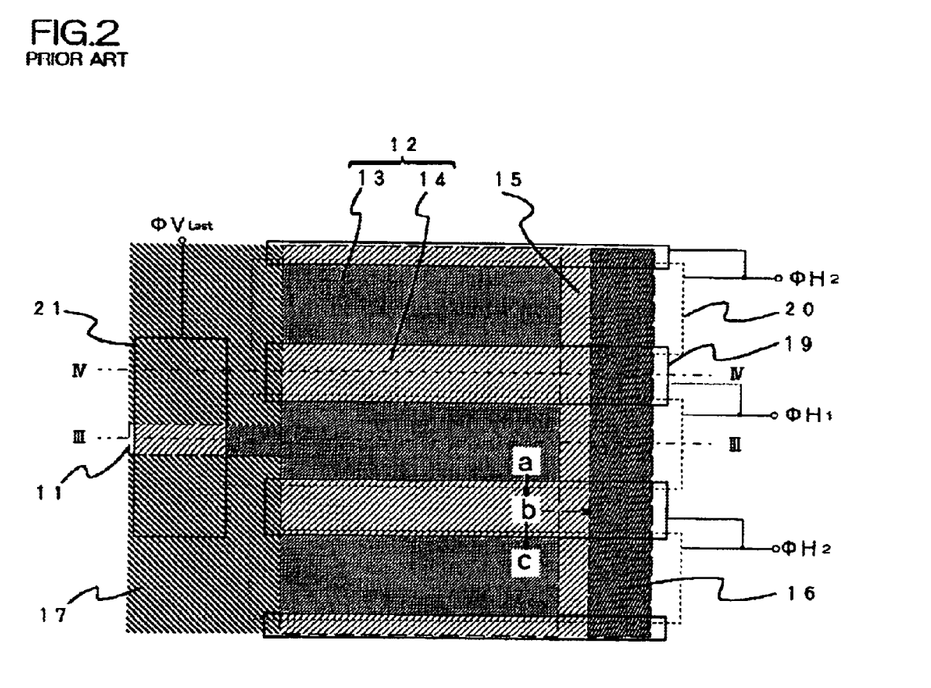
FIG. 2 is an enlarged plan view of the region encircled with a broken line A in FIG. 1.

FIG. 2 is a plan view of the region encircled with a broken line A in FIG. 1, that is, the region located adjacent to the second charge transfer section 3 and including the potential barrier section 5 and the excessive charge exhausting section 6.

As illustrated in FIG. 2, the region is comprised of a first charge transfer channel 11 for vertically transferring electric charges therethrough, second charge transfer sections 12 for horizontally transferring electric charges therethrough, located adjacent to the first charge transfer channel 11 and including a charge accumulating region 13 and a charge barrier region 14, a potential barrier section 15 located adjacent to the second charge transfer sections 12, an excessive charge exhausting section 16 located adjacent to the potential barrier section 15, a semiconductor region 17 acting as a device isolation region and having a first electrical conductivity, first charge transfer electrodes 19 for horizontally transferring electric charges therethrough, each composed of a first layer of polysilicon, second charge transfer electrodes 20 for horizontally transferring electric charges therethrough, each composed of a second layer of polysilicon, and a final charge transfer electrode 21 for vertically transferring electric charges.

Figure 3:
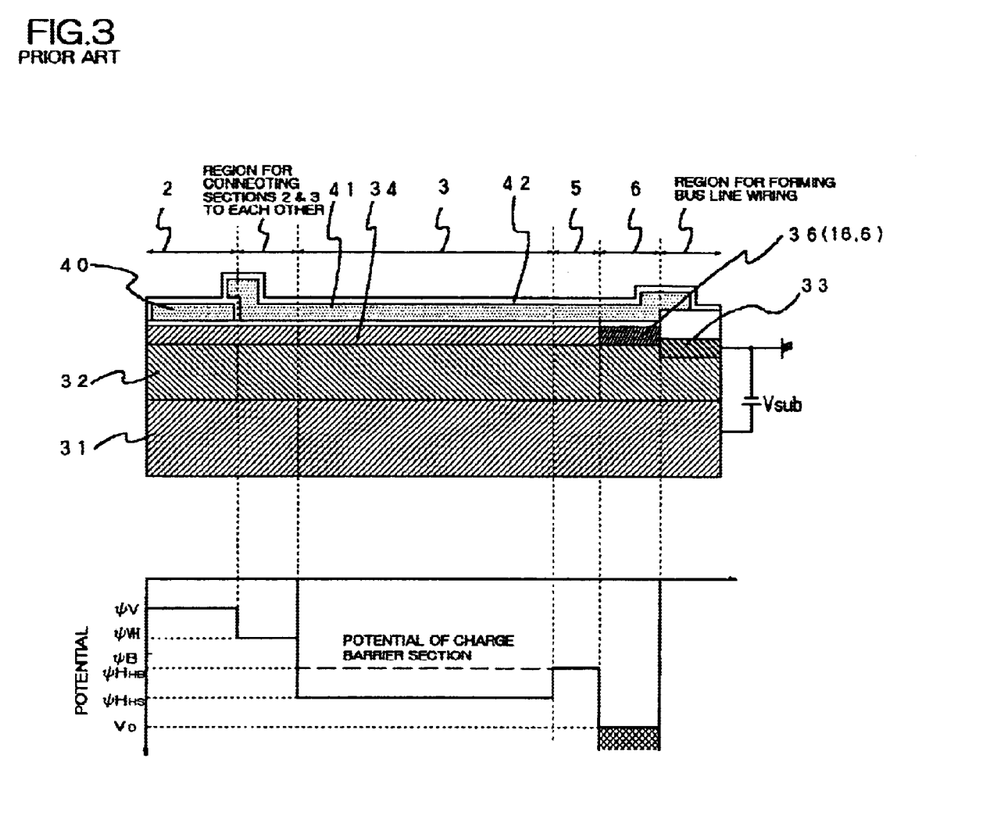
FIG. 3 is a cross-sectional view taken along the line III—III in FIG. 2, and shows potential of each region at the cross-section.
Figure 4:
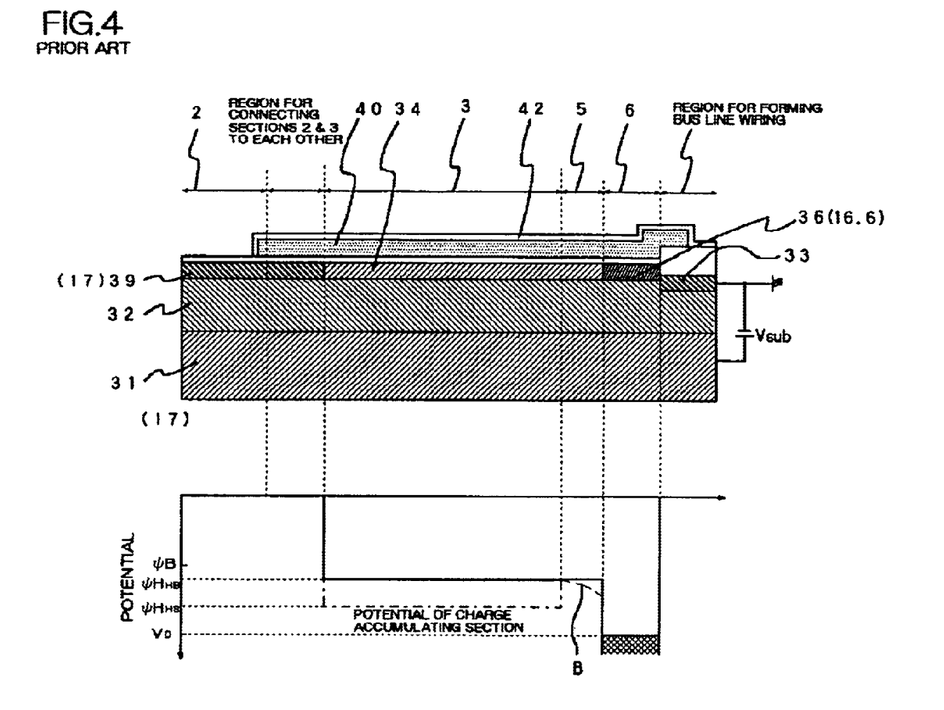
FIG. 4 is a cross-sectional view taken along the line IV—IV in FIG. 2, and shows potential of each region at the cross-section.

FIG. 3 is a cross-sectional view taken along the line III—III in FIG. 2, and shows potential of each region at the cross-section. FIG. 4 is a cross-sectional view taken along the line IV—IV in FIG. 2, and shows potential of each region at the cross-section.

As illustrated in FIGS. 3 and 4, the solid-state image sensor is comprised of an $n^{3-}$ semiconductor substrate 31 having an impurity concentration of about $2.0E14$ cm$^{-3}$, a p-type well layer 32 formed at a surface of the $n^{3-}$ semiconductor substrate 31 and having an impurity concentration of about $1.0E16$ cm$^{-3}$, an n− type semiconductor region 33 constituting a buried channel of the charge accumulating region 13 of the first and second charge transfer sections 2 and 3, and having an impurity concentration of about $1.3E17$ cm$^{-3}$, an n− type semiconductor region 34 constituting a buried channel of the charge barrier region 14 of the first and second charge transfer sections 2 and 3, and having an impurity concentration of about $1.0E17$ cm$^{-3}$, an n+ semiconductor region 36 constituting the excessive charge exhausting region 16, and having an impurity concentration of about $1.0E18$ cm$^{-3}$, a p++ semiconductor region 39 constituting the device isolation region, and having an impurity concentration of about $1.0E18$ cm$^{-3}$, the first charge transfer electrodes 19 for horizontally transferring electric charges therethrough, each composed of a first layer 40 of polysilicon, the second charge transfer electrodes 20 for horizontally transferring electric charges therethrough, each composed of a second layer 41 of polysilicon, an insulating layer 42 for electrically isolating the first layer 40 of polysilicon and the second layer 41 of polysilicon with each other, and the final charge transfer electrode 21 for vertically transferring electric charges.

A power source voltage VDD of about 15V is applied to the n+ semiconductor region 36 constituting the excessive charge exhausting section 16 through the n++ semiconductor region 7 formed at one end of the excessive charge exhausting region 6 and having an impurity concentration of about $1.0E20$ cm$^{-3}$.

Hereinbelow is explained an operation of the solid-state image sensor having the above-mentioned structure.

As mentioned earlier, removal of unnecessary charges existing in the light-electricity transfer sections 1 is carried out by forming a p− semiconductor region just below the n-type semiconductor region constituting the light-electricity transfer regions 1 and applying a reverse-bias voltage of about 15V which is greater than the power source voltage VDD, to the $n^{3-}$ semiconductor substrate 31. By application of the reverse-bias voltage to the semiconductor substrate 31, the n-type semiconductor region constituting the light-electricity transfer regions 1 are made depleted, and thus, signal charges are all removed into the semiconductor substrate 31.

Unnecessary charges existing in the first charge transfer sections 2 are transferred to the second charge transfer section 3, for instance, by application of four-phase clock pulses. In application of the four-phase clock pulses, a high level voltage VH is applied to a terminal ΦH1 and a low level voltage VL is applied to a terminal ΦH2 in the first and second charge transfer electrodes 19 and 20.

Thus, a potential of the first charge transfer section 2 is made deeper than a potential φVH established at a junction of the first and second charge transfer sections 2 and 3 so that excessive charges which cannot be accumulated in the charge accumulating region 13 of the second charge transfer region 3 are returned back to the first charge transfer sections 2. As a result, unnecessary charges existing in the first charge transfer sections 2 move over a potential φB (φB=φHB) of the potential barrier section 5 having the same potential as that of the charge barrier region 14, and are absorbed into the n+ semiconductor region 36 constituting the excessive charge exhausting section 6.

Thereafter, unnecessary charges residual in the second charge transfer section 3 are absorbed into an n++ semiconductor region formed at one end of the second charge transfer section 3 and constituting a reset drain, by means of two-phase clock pulses, in an ordinary operation of the second charge transfer section 3.

Then, signal charges accumulated in the light-electricity transfer sections 1 in an amount in accordance with light incident thereto in a certain period of time are read out into the associated first charge transfer section 2, and transferred to the second charge transfer section 3 through the first charge transfer section 2 by every horizontal line. Then, the signal charges are horizontally transferred through the second charge transfer section 3, and output through the output circuit 4.

However, in the above-mentioned conventional solid-state image sensors, a potential of the semiconductor region constituting the potential barrier region 5 located adjacent to the charge barrier region 14 is modulated by a potential applied to the semiconductor region constituting the excessive charge exhausting region 6, as shown with a broken line B in FIG. 4.

As a result, the above-mentioned conventional solid-state image sensors are accompanied with a problem that when signal charges are transferred from the terminal ΦH1 to the terminal ΦH2, that is, in a direction from "a" to "b" and from "b" to "c" in FIG. 2, a part of the signal charges leaks into the semiconductor region constituting the excessive charge exhausting section 16, which causes degradation in a charge transfer efficiency.

Japanese Unexamined Patent Publication No. 58-137249 has suggested a solid-state image sensor including a semiconductor substrate having a first electrical conductivity, an insulating film formed on the semiconductor substrate, a plurality of lower electrodes formed on the insulating film, and a plurality of upper electrodes formed above the lower electrodes in electrical isolation with each other and arranged in a direction crossing across a direction in which the lower electrodes are arranged. A gap defined within the lower and upper electrodes acts as a light-receiving section or a window through which light is incident. The semiconductor substrate is formed with a channel stopper region along one of the lower and upper electrodes. The channel stopper region is heavily doped with an impurity having the same electrical conductivity as that of the semiconductor substrate. The channel stopper region includes an overflow drain formed in zigzag fashion and having an electrical conductivity opposite to that of the channel stopper region. One of the lower and upper electrodes is used as an overflow control gate.

Japanese Unexamined Patent Publication No. 59-19480 has suggested a solid-state image sensor of vertical overflow drain type, in which a light-receiving section comprised of an n+ diffusion region is formed on a lightly doped p-type epitaxial layer which is formed on an n+ substrate, and a control gate is formed for controlling potential barrier between the n+ diffusion region and the p-type epitaxial layer. Signal charges are accumulated in or swept out of the light-receiving section by controlling both a voltage to be applied to the control gate and a voltage to be applied to the n+ substrate and the p-type epitaxial layer.

Japanese Unexamined Patent Publication No. 62-156859 has suggested a solid-state image sensor comprising (a) a first transfer channel including a unit cell comprising a doped well layer having a second electrical conductivity and formed in a semiconductor substrate having a first electrical conductivity, a signal accumulating layer which temporarily accumulates signal charges generated by light-electricity conversion of incident light, a reading-out channel which reads out signal charges accumulated in the signal accumulating layer, and means for sweeping out excessive charges accumulated in the charge accumulating layer, said unit cell being arranged on a two-dimensional plane with a barrier layer sandwiched therebetween, said first transfer channel transferring charges having been read out from the reading-out channel, in a single first direction, and (b) a second transfer channel which transfers charges having been transferred from the first transfer channel, in a second direction perpendicular to the first direction. The barrier layer and means for applying a certain voltage to the doped well layer are electrically connected to each other through a low-resistive element.

Japanese Unexamined Patent Publication No. 62-157479 has suggested a method of driving a solid-state image sensor comprised of (a) a plurality of light-electricity conversion sections which generates signal charges by light-electricity conversion of incident light, and includes charge accumulating layers for accumulating the thus generated signal charges, (b) first means for reading out signal charges accumulated in the light-electricity conversion sections, and (c) second means for sweeping out excessive charges produced in the light-electricity conversion sections. In the method, a pulse width which defines a period of time for reading out charges, the pulse being applied to the first means, is varied in accordance with an intensity of incident light, and a barrier potential of the second means is set lower than a barrier potential of the first means.

Japanese Unexamined Patent Publication No. 63-228747 has suggested a solid-state image sensor of frame transfer type, in which an opening window is formed between an upper layer gate electrode and a lower layer gate electrode of a picture taking section, and a portion of an opening region located below the opening window, closer to an overflow drain region, is formed to contain an impurity at a higher concentration than other portions.

However, such a problem as mentioned above remains unsolved even in the above-mentioned Publications.

SUMMARY OF THE INVENTION

In view of the above-mentioned problem in the conventional solid-state image sensors, it is an object of the present invention to provide a solid-state image sensor having such a horizontal overflow drain as mentioned above, which is capable of preventing signal charges from leaking into an excessive charge exhausting region, and hence, enhancing a charge transfer efficiency.

There is provided a solid-state image sensor including (a) a plurality of first charge transfer sections each for vertically transferring electric charges, formed on a surface of a semiconductor layer, (b) a second charge transfer section for horizontally transferring electric charges, formed adjacent to one ends of the first charge transfer sections, the second charge transfer section including a charge barrier region and a charge accumulating region, (c) a first potential barrier section located adjacent to the second charge transfer section, (d) an excessive charge exhausting section located adjacent to the first potential barrier section, and (e) a plurality of second potential barrier sections located in the first potential barrier section, the second potential barrier sections being spaced away from adjacent ones.

It is preferable that each of the second potential barrier sections is composed of a semiconductor region having a first electrical conductivity, and the first potential barrier section is composed of a semiconductor region having a second electrical conductivity.

It is preferable that the second potential barrier sections have the same electrical conductivity as that of the semiconductor layer.

It is preferable that the second potential barrier sections have a higher impurity-concentration than that of the semiconductor layer.

It is preferable that the second potential barrier sections have the same electrical conductivity as that of the first potential barrier section.

It is preferable that the second potential barrier sections have a lower impurity-concentration than that of the first potential barrier section.

It is preferable that the second potential barrier sections have the same composition as that of a device isolation region which electrically isolates a region from adjacent regions, and is formed in a step in which the device isolation region is also formed.

It is preferable that the solid-state image sensor further includes a plurality of charge transfer electrodes each for horizontally transferring electric charges, located adjacent to the charge barrier region, the charge transfer electrodes being formed extending on the second potential barrier sections.

It is preferable that the second potential barrier sections are spaced away from adjacent ones by about 1 $\mu$m.

It is preferable that the charge transfer electrodes extend on both the first potential barrier region and the excessive charge exhausting section with an insulating film sandwiched therebetween.

It is preferable that the charge transfer electrodes are of two-layer electrode and two-phase drive system or single-layer electrode and two-phase drive system.

There is further provided a solid-state image sensor including (a) a plurality of first charge transfer sections each for vertically transferring electric charges, formed on a surface of a semiconductor layer having a first electrical conductivity, each of the first charge transfer sections being formed of a semiconductor region having a second electrical conductivity, (b) a second charge transfer section for horizontally transferring electric charges, formed adjacent to one ends of the first charge transfer sections, the second charge transfer section including a charge barrier region formed of a second semiconductor region having a second electrical conductivity and a charge accumulating region formed of a third semiconductor region having a second electrical conductivity and having a higher impurity-concentration than that of the second semiconductor region, (c) a first potential barrier section located adjacent to the second charge transfer section and formed of a fourth semiconductor region having a second electrical conductivity, (d) an excessive charge exhausting section located adjacent to the first potential barrier section and formed of a fifth semiconductor region having a second electrical conductivity and having a higher impurity-concentration than that of the first semiconductor region, and (e) a plurality of second potential barrier sections located in the fourth semiconductor region and formed of a semiconductor region having a first electrical conductivity, the second potential barrier sections being spaced away from adjacent ones.

It is preferable that the second semiconductor region is the same as the fourth semiconductor region.

There is further provided a solid-state image sensor including (a) a plurality of first charge transfer sections each for vertically transferring electric charges, formed on a surface of a semiconductor layer having a first electrical conductivity, each of the first charge transfer sections being formed of a semiconductor region having a second electrical conductivity, (b) a second charge transfer section for horizontally transferring electric charges, formed adjacent to one ends of the first charge transfer sections, the second charge transfer section including a charge barrier region formed of a second semiconductor region having a second electrical conductivity and a charge accumulating region formed of a third semiconductor region having a second electrical conductivity and having a higher impurity-concentration than that of the second semiconductor region, (c) a first potential barrier section located adjacent to the second charge transfer section and formed of a fourth semiconductor region having a second electrical conductivity, (d) an excessive charge exhausting section located adjacent to the first potential barrier section and formed of a fifth semiconductor region having a second electrical conductivity and having a higher impurity-concentration than that of the first semiconductor region, and (e) a plurality of second potential barrier sections located in the fourth semiconductor region and formed of a sixth semiconductor region having a second electrical conductivity and having a lower impurity-concentration than that of the fourth semiconductor region, the second potential barrier sections being spaced away from adjacent ones.

The advantages obtained by the aforementioned present invention will be described hereinbelow.

In the solid-state image sensor in accordance with the present invention, the p+ semiconductor region, the p++ semiconductor region or the $n^{2-}$ semiconductor region constituting the second potential barrier sections is formed in the n– semiconductor region constituting the potential barrier section located adjacent to the charge barrier region. Hence, it is possible to prevent a potential of the potential barrier section from being influenced by a potential applied to the n+ semiconductor region constituting the excessive charge exhausting section located adjacent tot he potential barrier section. As a result, when signal charges are transferred from the terminal ΦH1 to the terminal ΦH2, that is, in a direction from "a" to "b" and from "b" to "c" in FIGS. 5, 7 and 9, it is possible to prevent a part of the signal charges from leaking into the n+ semiconductor region constituting the excessive charge exhausting section, which ensures enhancement in a charge transfer efficiency.

In addition, as mentioned later in the second embodiment, if the p++ semiconductor region constituting the second potential barrier sections are formed concurrently with the device isolation regions, as a part of the device isolation regions, it would be possible to reduce the number of fabrication steps.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 5:
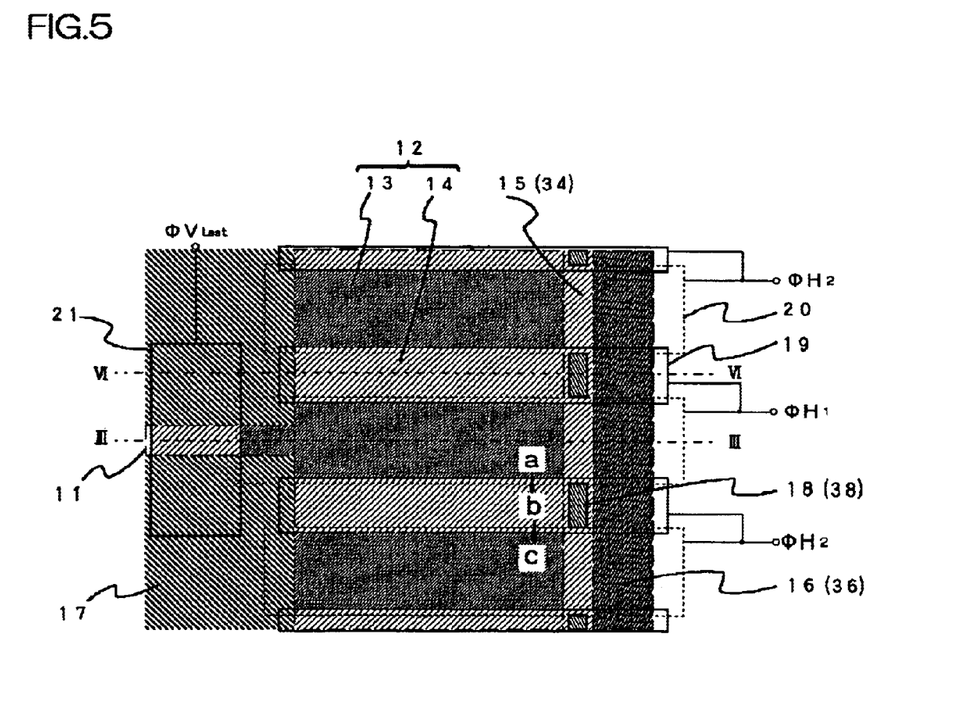
FIG. 5 is a plan view of a region including a charge exhausting section located adjacent to a charge transfer section which horizontally transfers electric charges therethrough, in a solid-state image sensor in accordance with the first embodiment.

FIG. 5 is an enlarged plan view of a region in a solid-state image sensor in accordance with the first embodiment, corresponding to the region encircled with the broken line A in FIG. 1. That is, FIG. 5 is a plan view of a region including a potential barrier section 5 and an excessive charge exhausting section 6 adjacent to a second charge transfer section 3 which horizontally transfers electric charges therethrough, in a solid-state image sensor in accordance with the first embodiment. In FIG. 5, parts or elements that correspond to those of the conventional solid-state image sensor illustrated in FIG. 2 have been provided with the same reference numerals.

The solid-state image sensor in accordance with the first embodiment, illustrated in FIG. 5, is structurally different from the conventional solid-state image sensor illustrated in FIG. 2 in that there are formed a plurality of second potential barrier sections 18 in the potential barrier section 15 located below the first charge transfer electrodes 19 located adjacent to the charge barrier region 14 constituting the second charge transfer section 3. As illustrated in FIG. 5, the second potential barrier sections 18 are spaced away from adjacent ones by a predetermined distance.

Figure 6:
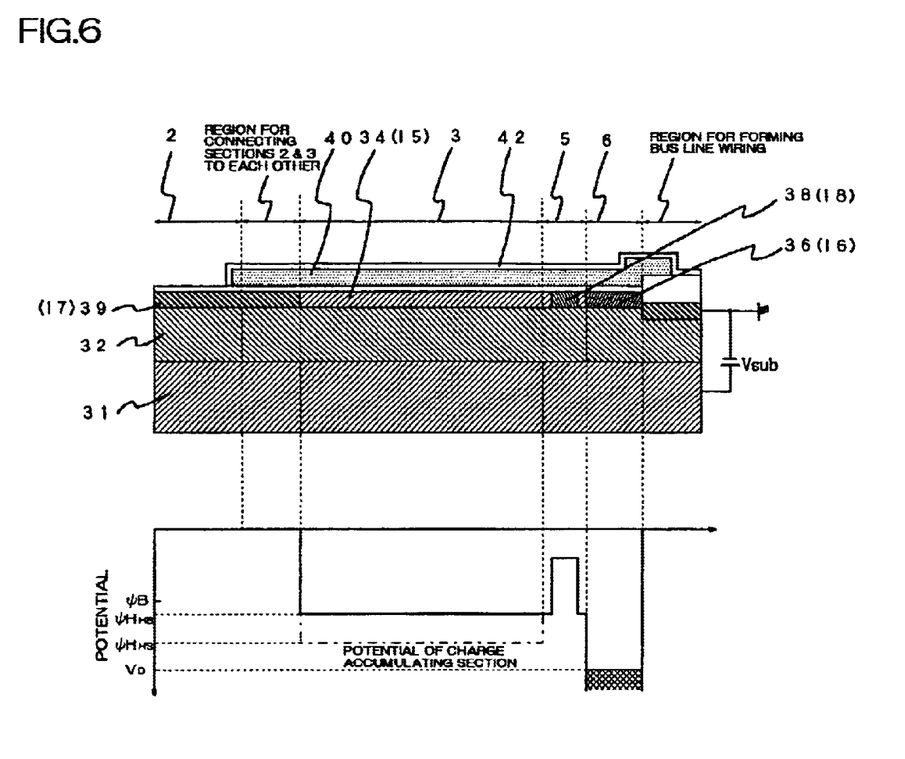
FIG. 6 is a cross-sectional view taken along the line VI—VI in FIG. 5, and shows potential of each region at the cross-section.

FIG. 6 is a cross-sectional view taken along the line VI—VI in FIG. 5, and shows potential of each region at the cross-section. A cross-sectional view taken along the line III—III in FIG. 5 and potential of each region at the cross-section are the same as FIG. 3, and hence, will not be explained. In FIG. 6, parts or elements that correspond to those of the conventional solid-state image sensor illustrated in FIG. 4 have been provided with the same reference numerals.

The solid-state image sensor in accordance with the first embodiment, illustrated in FIG. 6, is structurally different from the conventional solid-state image sensor illustrated in FIG. 4 in that there are formed a plurality of second potential barrier sections 18 in the potential barrier section 15 located adjacent to the charge barrier region 14 located below a first layer 40 of polysilicon constituting the first charge transfer electrodes 19. The second potential barrier sections 18 are spaced away from adjacent ones by a predetermined distance, for instance, by about 1 μm.

The potential barrier section 15 is comprised of an n− semiconductor region 34 having an impurity-concentration of about 1.0E17 cm$^{-3}$, and each of the second potential barrier sections 18 is comprised of a p+ semiconductor region 38 having an impurity-concentration of about 1.0E17 cm$^{-3}$.

The solid-state image sensor in accordance with the first embodiment, having the above-mentioned structure, operates in the same manner as the conventional solid-state image sensor.

In addition, since the solid-state image sensor in accordance with the first embodiment is designed to include the p+ semiconductor region 38 constituting the second potential barrier sections 18, in the n− semiconductor region 34 constituting the potential barrier section 15, it is possible to prevent a potential of the potential barrier section 15 from being varied by a potential applied to the n+ semiconductor region 36 constituting the excessive charge exhausting section 16 formed adjacent to the potential barrier section 15. Accordingly, when signal charges are transferred from the terminal ΦH1 to the terminal ΦH2, that is, in a direction from "a" to "b" and from "b" to "c" in FIG. 5, it is possible to prevent a part of the signal charges from leaking into the n+ semiconductor region 36 constituting the excessive charge exhausting section 16, which ensures enhancement in a charge transfer efficiency.

Figure 7:
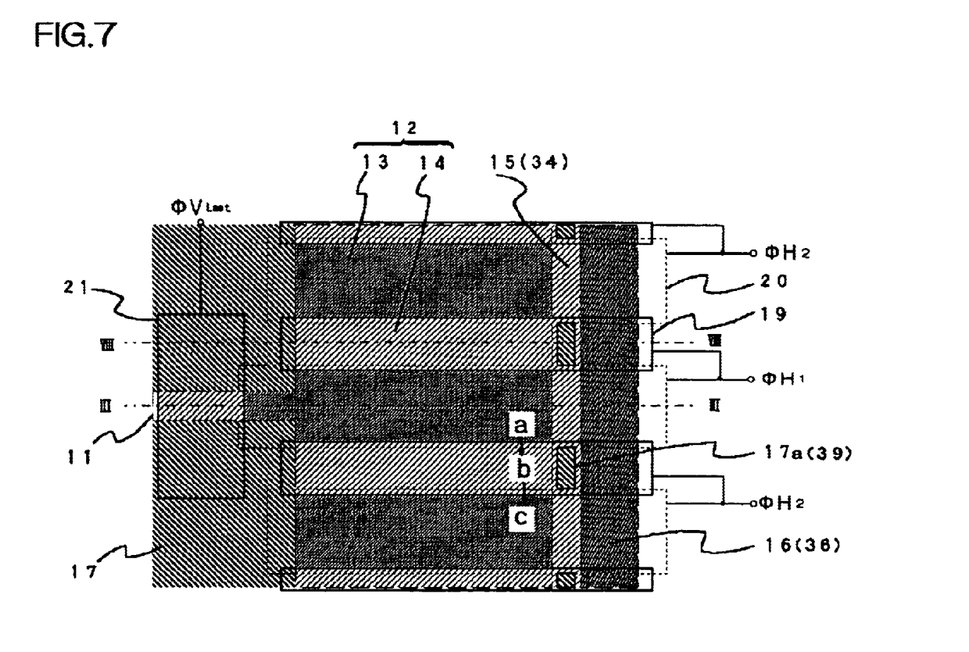
FIG. 7 is a plan view of a region including a charge exhausting section located adjacent to a charge transfer section which horizontally transfers electric charges therethrough, in a solid-state image sensor in accordance with the second embodiment.

FIG. 7 is an enlarged plan view of a region in a solid-state image sensor in accordance with the second embodiment, corresponding to the region encircled with the broken line A in FIG. 1. That is, FIG. 7 is a plan view of a region including a potential barrier section 5 and an excessive charge exhausting section 6 adjacent to a second charge transfer section 3 which horizontally transfers electric charges therethrough, in a solid-state image sensor in accordance with the second embodiment. In FIG. 7, parts or elements that correspond to those of the conventional solid-state image sensor illustrated in FIG. 2 have been provided with the same reference numerals.

The solid-state image sensor in accordance with the second embodiment, illustrated in FIG. 7, is structurally different from the conventional solid-state image sensor illustrated in FIG. 2 in that there are formed a plurality of second potential barrier sections 17a in the potential barrier section 15 located below the first charge transfer electrodes 19 located adjacent to the charge barrier region 14 constituting the second charge transfer section 3. As illustrated in FIG. 7, the second potential barrier sections 17a are spaced away from adjacent ones by a predetermined distance. The second potential barrier sections 17a have the same structure as that of a device isolation region 17 which defines an area in which a device is to be fabricated by surrounding the area, and are formed in a step in which the device isolation regions 17 are also formed.

Figure 8:
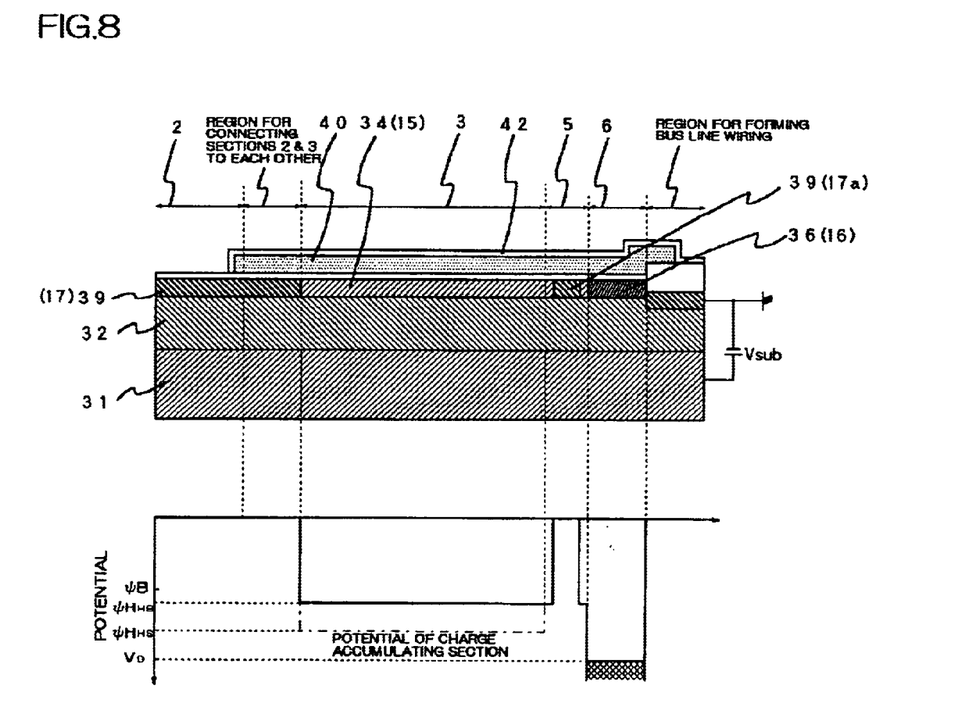
FIG. 8 is a cross-sectional view taken along the line VIII—VIII in FIG. 7, and shows potential of each region at the cross-section.

FIG. 8 is a cross-sectional view taken along the line VIII—VIII in FIG. 7, and shows potential of each region at the cross-section. A cross-sectional view taken along the line III—III in FIG. 7 and potential of each region at the cross-section are the same as FIG. 3, and hence, will not be explained. In FIG. 8, parts or elements that correspond to those of the conventional solid-state image sensor illustrated in FIG. 4 have been provided with the same reference numerals.

The solid-state image sensor in accordance with the second embodiment, illustrated in FIG. 8, is structurally different from the conventional solid-state image sensor illustrated in FIG. 4 in that there are formed a plurality of second potential barrier sections 17a in the potential barrier section 15 located adjacent to the charge barrier region 14 located below a first layer 40 of polysilicon constituting the first charge transfer electrodes 19. The second potential barrier sections 17a are spaced away from adjacent ones by a predetermined distance, for instance, by about 1 μm.

Each of the second potential barrier sections 17a has the same structure as the structure of the device isolation region 17. The potential barrier section 15 is comprised of an n− semiconductor region 34 having an impurity-concentration of about 1.0E17 cm$^{-3}$, and each of the second potential barrier sections 17a is comprised of a p++ semiconductor region 39 having an impurity-concentration of about 1.0E18 cm$^{-3}$.

The solid-state image sensor in accordance with the second embodiment, having the above-mentioned structure, operates in the same manner as the conventional solid-state image sensor.

In addition, since the solid-state image sensor in accordance with the second embodiment is designed to include the p++ semiconductor region 39 constituting the second potential barrier sections 17a each of which has the same structure as that of the device isolation region 17, in the n− semiconductor region 34 constituting the potential barrier section 15, it is possible to prevent a potential of the potential barrier section 15 from being varied by a potential applied to the n+ semiconductor region 36 constituting the excessive charge exhausting section 16 formed adjacent to the potential barrier section 15. Accordingly, when signal charges are transferred from the terminal ΦH1 to the terminal ΦH2, that is, in a direction from "a" to "b" and from "b" to "c" in FIG. 7, it is possible to prevent a part of the signal charges from leaking into the n+ semiconductor region 36 constituting the excessive charge exhausting section 16, which ensures enhancement in a charge transfer efficiency.

In addition, since the p++ semiconductor region 39 constituting the second potential barrier sections 17a are formed concurrently with the device isolation region 17, as a part of the device isolation region 17, it would be possible to reduce the number of fabrication steps relative to the same in the first embodiment.

Figure 9:
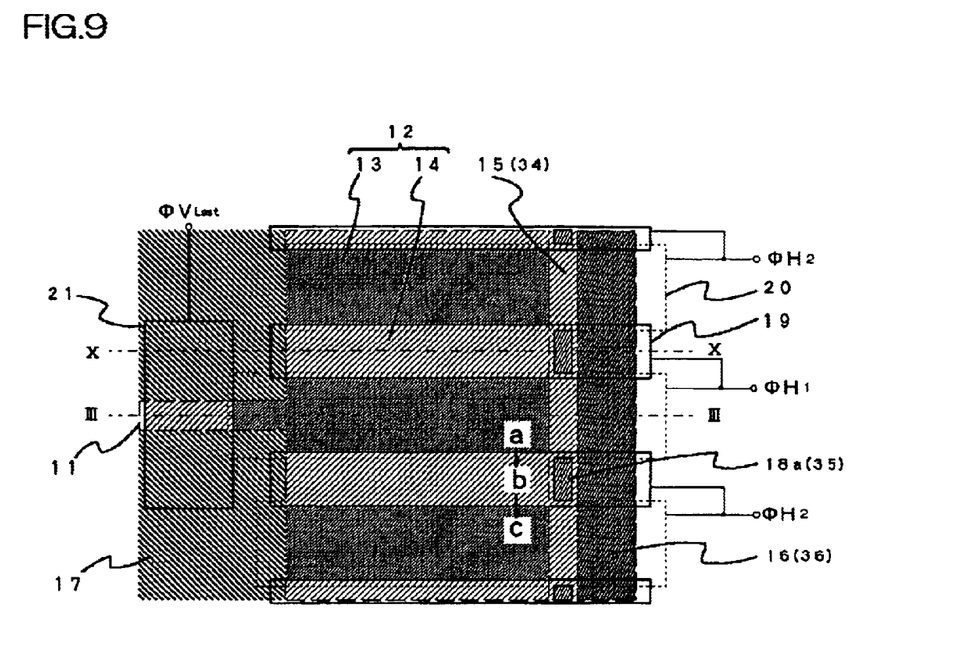
FIG. 9 is a plan view of a region including a charge exhausting section located adjacent to a charge transfer section which horizontally transfers electric charges therethrough, in a solid-state image sensor in accordance with the third embodiment.

FIG. 9 is an enlarged plan view of a region in a solid-state image sensor in accordance with the third embodiment, corresponding to the region encircled with the broken line A in FIG. 1. That is, FIG. 9 is a plan view of a region including a potential barrier section 5 and an excessive charge exhausting section 6 adjacent to a second charge transfer section 3 which horizontally transfers electric charges therethrough, in a solid-state image sensor in accordance with the third embodiment. In FIG. 9, parts or elements that correspond to those of the conventional solid-state image sensor illustrated in FIG. 2 have been provided with the same reference numerals.

The solid-state image sensor in accordance with the third embodiment, illustrated in FIG. 9, is structurally different from the conventional solid-state image sensor illustrated in FIG. 2 in that there are formed a plurality of second potential barrier sections 18a in the potential barrier section 15 located below the first charge transfer electrodes 19 located adjacent to the charge barrier region 14 constituting the second charge transfer section 3. As illustrated in FIG. 9, the second potential barrier sections 18 are spaced away from adjacent ones by a predetermined distance.

Figure 10:
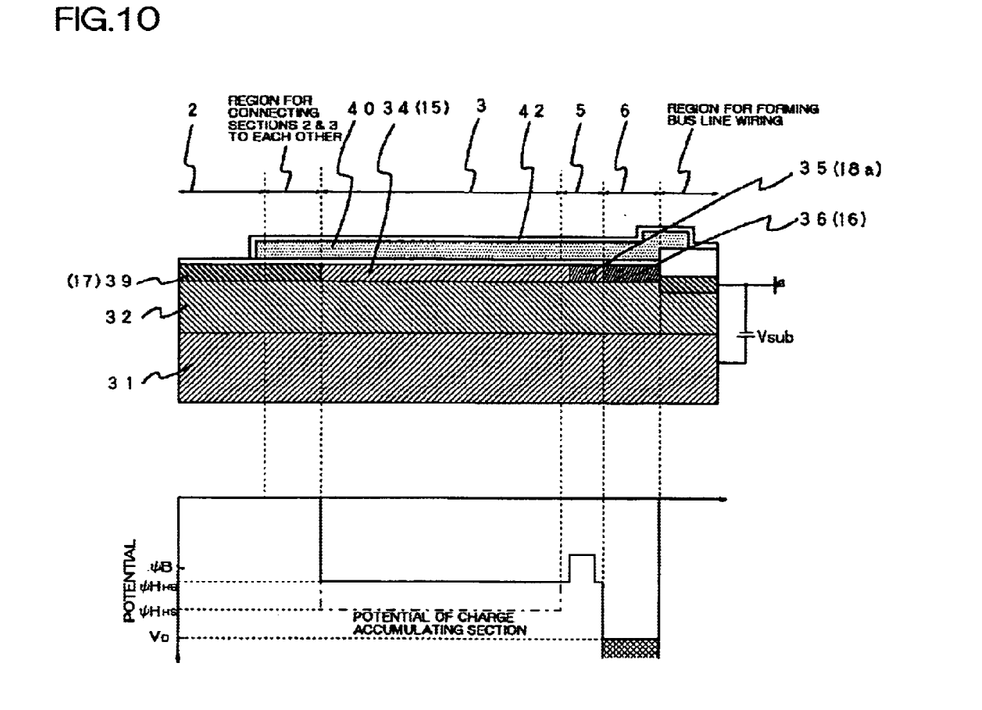
FIG. 10 is a cross-sectional view taken along the line X—X in FIG. 9, and shows potential of each region at the cross-section.

FIG. 10 is a cross-sectional view taken along the line X—X in FIG. 9, and shows potential of each region at the cross-section. A cross-sectional view taken along the line III—III in FIG. 9 and potential of each region at the cross-section are the same as FIG. 3, and hence, will not be explained. In FIG. 10, parts or elements that correspond to those of the conventional solid-state image sensor illustrated in FIG. 4 have been provided with the same reference numerals.

The solid-state image sensor in accordance with the third embodiment, illustrated in FIG. 10, is structurally different from the conventional solid-state image sensor illustrated in FIG. 4 in that there are formed a plurality of second potential barrier sections 18a in the potential barrier section 15 located adjacent to the charge barrier region 14 located below a first layer 40 of polysilicon constituting the first charge transfer electrodes 19. The second potential barrier sections 18a are spaced away from adjacent ones by a predetermined distance, for instance, by about 1 $\mu$m.

The potential barrier section 15 is comprised of an n– semiconductor region 34 having an impurity-concentration of about $1.0E17$ cm$^{-3}$, and each of the second potential barrier sections 18a is comprised of an n$^{2-}$ semiconductor region 35 having an impurity-concentration of about $5.0E16$ cm$^{-3}$.

The solid-state image sensor in accordance with the third embodiment, having the above-mentioned structure, operates in the same manner as the conventional solid-state image sensor.

In addition, since the solid-state image sensor in accordance with the third embodiment is designed to include the n$^{2-}$ semiconductor region 35 constituting the second potential barrier sections 18a, in the n– semiconductor region 34 constituting the potential barrier section 15, it is possible to prevent a potential of the potential barrier section 15 from being varied by a potential applied to the n+ semiconductor region 36 constituting the excessive charge exhausting section 16 formed adjacent to the potential barrier section 15. Accordingly, when signal charges are transferred from the terminal $\Phi$H1 to the terminal $\Phi$H2, that is, in a direction from "a" to "b" and from "b" to "c" in FIG. 9, it is possible to prevent a part of the signal charges from leaking into the n+ semiconductor region 36 constituting the excessive charge exhausting section 16, which ensures enhancement in a charge transfer efficiency.

In the above-mentioned first to third embodiments, there were explained the solid-state image sensors including a two-layered electrode and two-phase drive type charge transfer section for horizontally transferring electric charges therethrough. However, as illustrated in FIG. 11, it should be noted that the solid-state image sensor in accordance with the above-mentioned first to third embodiments may be designed to have a single-layered electrode and two-phase drive type charge transfer section which may be formed as a single charge transfer electrode 22 for horizontally transferring electric charges therethrough.

Herein, the charge transfer electrode 22 is comprised of the first charge transfer electrode 19 and the second charge transfer electrode 20 both of which are in-phase.

Figure 11:
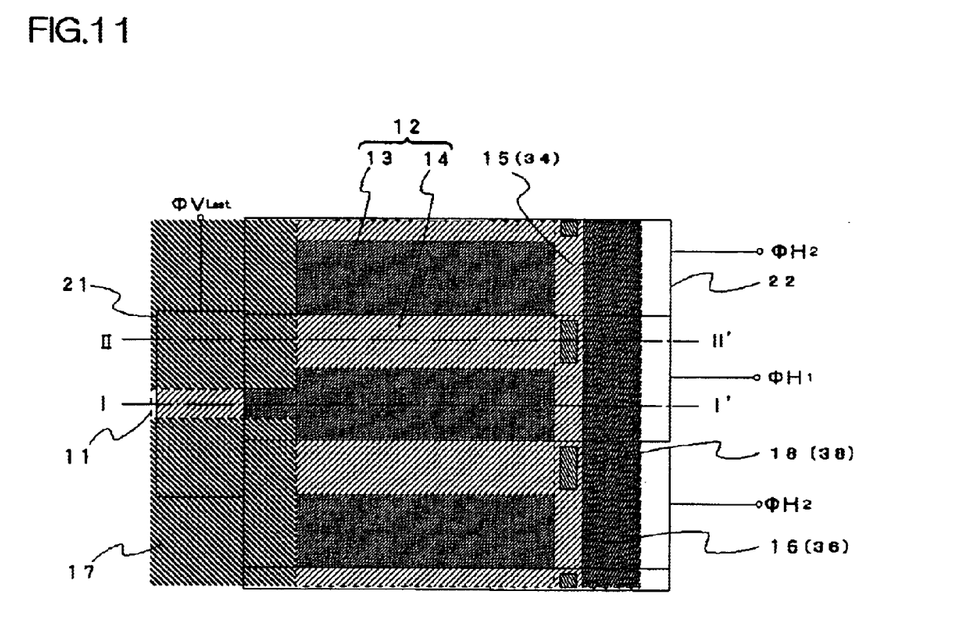
FIG. 11 is a plan view illustrating a variant of the solid-state image sensors in accordance with the first to third embodiments.

Though the charge transfer electrodes 22 illustrated in FIG. 11 seems to make contact with one another, the charge transfer electrodes 22 are actually spaced away from adjacent ones by a distance in the range of about 0.1 $\mu$m to about 0.3 $\mu$m.

The electrical conductivity mentioned in the first to third embodiments is not to be limited to the above-mentioned one. The first electrical conductivity, that is, p-type conductivity may be changed into the second conductivity, that is, n-type conductivity, and vice versa.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-264591 filed on Sep. 18, 1998 including specification, claims, drawings and summary is incorporated herein by reference in its entirety.

What is claimed is:

1. A solid-state image sensor comprising:
   (a) a plurality of first charge transfer sections each for vertically transferring electric charges, formed on a surface of a semiconductor layer;
   (b) a second charge transfer section for horizontally transferring electric charges, formed adjacent to one ends of said first charge transfer sections, said second charge transfer section including a charge barrier region and a charge accumulating region;
   (c) a first potential barrier section located adjacent to said second charge transfer section;
   (d) an excessive charge exhausting section located adjacent to said first potential barrier section; and
   (e) a plurality of second potential barrier sections located in said first potential barrier section, said second potential barrier sections being spaced away from adjacent ones.

2. The solid-state image sensor as set forth in claim 1, wherein each of said second potential barrier sections is composed of a semiconductor region having a first electrical conductivity, and said first potential barrier section is composed of a semiconductor region having a second electrical conductivity.

3. The solid-state image sensor as set forth in claim 1, wherein said second potential barrier sections have the same electrical conductivity as that of said semiconductor layer.

4. The solid-state image sensor as set forth in claim 3, wherein said second potential barrier sections have a higher impurity-concentration than that of said semiconductor layer.

5. The solid-state image sensor as set forth in claim 1, wherein said second potential barrier sections have the same electrical conductivity as that of said first potential barrier section.

6. The solid-state image sensor as set forth in claim 5, wherein said second potential barrier sections have a lower impurity-concentration than that of said first potential barrier section.

7. The solid-stage image sensor as set forth in claim 1, wherein said second potential barrier sections have the same composition as that of a device isolation region which electrically isolates a region from adjacent regions, and is formed in a step in which said device isolation region is also formed.

8. The solid-stage image sensor as set forth in claim 1, further comprising a plurality of charge transfer electrodes each for horizontally transferring electric charges, located adjacent to said charge barrier region, said charge transfer electrodes being formed extending on said second potential barrier sections.

9. The solid-stage image sensor as set forth in claim 1, wherein said second potential barrier sections are spaced away from adjacent ones by about 1 µm.

10. The solid-stage image sensor as set forth in claim 8, wherein said charge transfer electrodes extend on both said first potential barrier region and said excessive charge exhausting section with an insulating film sandwiched therebetween.

11. The solid-stage image sensor as set forth in claim 8, wherein said charge transfer electrodes are of two-layer electrode and two-phase drive system.

12. The solid-stage image sensor as set forth in claim 8, wherein said charge transfer electrodes are of single-layer electrode and two-phase drive system.

13. A solid-state image sensor comprising:
(a) a plurality of first charge transfer sections each for vertically transferring electric charges, formed on a surface of a semiconductor layer having a first electrical conductivity, each of said first charge transfer sections being formed of a semiconductor region having a second electrical conductivity;
(b) a second charge transfer section for horizontally transferring electric charges, formed adjacent to one ends of said first charge transfer sections, said second charge transfer section including a charge barrier region formed of a second semiconductor region having a second electrical conductivity and a charge accumulating region formed of a third semiconductor region having a second electrical conductivity and having a higher impurity-concentration than that of said second semiconductor region;
(c) a first potential barrier section located adjacent to said second charge transfer section and formed of a fourth semiconductor region having a second electrical conductivity;
(d) an excessive charge exhausting section located adjacent to said first potential barrier section and formed of a fifth semiconductor region having a second electrical conductivity and having a higher impurity-concentration than that of said first semiconductor region; and
(e) a plurality of second potential barrier sections located in said fourth semiconductor region and formed of a semiconductor region having a first electrical conductivity, said second potential barrier sections being spaced away from adjacent ones.

14. The solid-stage image sensor as set forth in claim 13, wherein said second semiconductor region is the same as said fourth semiconductor region.

15. The solid-stage image sensor as set forth in claim 13, wherein said second potential barrier sections have the same composition as that of a device isolation region which electrically isolates a region from adjacent regions, and is formed in a step in which said device isolation region is also formed.

16. The solid-stage image sensor as set forth in claim 13, further comprising a plurality of charge transfer electrodes each for horizontally transferring electric charges, located adjacent to said charge barrier region, said charge transfer electrodes being formed extending on said second potential barrier sections.

17. The solid-stage image sensor as set forth in claim 13, wherein said second potential barrier sections are spaced away from adjacent ones by about 1 µm.

18. The solid-stage image sensor as set forth in claim 16, wherein said charge transfer electrodes extend on both said first potential barrier region and said excessive charge exhausting section with an insulating film sandwiched therebetween.

19. The solid-stage image sensor as set forth in claim 16, wherein said charge transfer electrodes are of two-layer electrode and two-phase drive system.

20. The solid-stage image sensor as set forth in claim 16, wherein said charge transfer electrodes are of single-layer electrode and two-phase drive system.

21. A solid-state image sensor comprising:
(a) a plurality of first charge transfer sections each for vertically transferring electric charges, formed on a surface of a semiconductor layer having a first electrical conductivity, each of said first charge transfer sections being formed of a semiconductor region having a second electrical conductivity;
(b) a second charge transfer section for horizontally transferring electric charges, formed adjacent to one ends of said first charge transfer sections, said second charge transfer section including a charge barrier region formed of a second semiconductor region having a second electrical conductivity and a charge accumulating region formed of a third semiconductor region having a second electrical conductivity and having a higher impurity-concentration than that of said second semiconductor region;
(c) a first potential barrier section located adjacent to said second charge transfer section and formed of a fourth semiconductor region having a second electrical conductivity;
(d) an excessive charge exhausting section located adjacent to said first potential barrier section and formed of a fifth semiconductor region having a second electrical conductivity and having a higher impurity-concentration than that of said first semiconductor region; and
(e) a plurality of second potential barrier sections located in said fourth semiconductor region and formed of a sixth semiconductor region having a second electrical conductivity and having a lower impurity-concentration than that of said fourth semiconductor region, said second potential barrier sections being spaced away from adjacent ones.

22. The solid-stage image sensor as set forth in claim 21, wherein said second semiconductor region is the same as said fourth semiconductor region.

23. The solid-stage image sensor as set forth in claim 21, further comprising a plurality of charge transfer electrodes each for horizontally transferring electric charges, located adjacent to said charge barrier region, said charge transfer electrodes being formed extending on said second potential barrier sections.

24. The solid-stage image sensor as set forth in claim 21, wherein said second potential barrier sections are spaced away from adjacent ones by about 1 µm.

25. The solid-stage image sensor as set forth in claim 23, wherein said charge transfer electrodes extend on both said first potential barrier region and said excessive charge exhausting section with an insulating film sandwiched therebetween.

26. The solid-stage image sensor as set forth in claim 23, wherein said charge transfer electrodes are of two-layer electrode and two-phase drive system.

27. The solid-stage image sensor as set forth in claim 23, wherein said charge transfer electrodes are of single-layer electrode and two-phase drive system.

* * * * *